US006539326B1

United States Patent
Hirano

(10) Patent No.: US 6,539,326 B1
(45) Date of Patent: Mar. 25, 2003

(54) POSITION DETECTING SYSTEM FOR PROJECTION EXPOSURE APPARATUS

(75) Inventor: Tomohiko Hirano, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/442,149

(22) Filed: Nov. 18, 1999

(30) Foreign Application Priority Data

Nov. 20, 1998 (JP) ............................. 10-330921

(51) Int. Cl.[7] .......................... G03B 27/52; G06K 9/00
(52) U.S. Cl. .......................... 702/150; 355/30; 355/43; 382/151; 250/548
(58) Field of Search .......................... 702/150, 159, 702/172; 250/201.2, 204, 236, 237, 548, 30, 43; 355/53, 55, 628; 356/623; 359/211, 379; 382/151

(56) References Cited

U.S. PATENT DOCUMENTS

| 4,395,117 A | * | 7/1983 | Suzuki | 355/43 |
| 4,506,977 A | * | 3/1985 | Sato et al. | 355/53 |
| 4,650,983 A | * | 3/1987 | Suwa | 250/204 |
| 4,668,077 A | * | 5/1987 | Tanaka | 355/43 |
| 4,705,940 A | * | 11/1987 | Kohno | 355/55 |
| 4,780,747 A | * | 10/1988 | Suzuki et al. | 355/68 |
| 4,801,977 A | * | 1/1989 | Ishizaka et al. | 355/30 |
| 4,874,954 A | * | 10/1989 | Takahashi et al. | 250/548 |
| 4,952,970 A | * | 8/1990 | Suzuki et al. | 355/43 |
| 5,117,254 A | * | 5/1992 | Kawashima et al. | 355/43 |
| 5,602,399 A | * | 2/1997 | Mizutani | 250/548 |
| 5,834,767 A | * | 11/1998 | Hasegawa et al. | 250/237 G |
| 6,081,614 A | * | 6/2000 | Yamada et al. | 382/151 |

FOREIGN PATENT DOCUMENTS

JP          1-286418          11/1989

\* cited by examiner

Primary Examiner—John S. Hilten
Assistant Examiner—John Le
(74) Attorney, Agent, or Firm—Fitzpatrick, Cella, Harper & Scinto

(57) ABSTRACT

A position detecting method for detecting a position of a surface of an object. The method includes a first step for detecting registration of the object surface with a predetermined plane with respect to a first direction, while changing the position of the object surface in a direction intersecting with the first direction, a second step for detecting the position of the object surface in the first direction, and determining a detection value in the second detecting step, corresponding to the predetermined plane, by use of an error in the result of the detection made with reference to the predetermined plane, which error is attributable to a difference in the detection position along a direction intersecting with the first direction and upon the same object surface in the first and second detecting steps.

18 Claims, 11 Drawing Sheets

POSITION DETECTING SYSTEM FOR PROJECTION EXPOSURE APPARATUS

FIELD OF THE INVENTION AND RELATED ART

This invention relates generally to a position detecting method or position detecting system, and a projection exposure method and apparatus, and a device manufacturing method using the same. The present invention is particularly suitably usable in a projection exposure apparatus called a stepper, for the maintenance of semiconductor devices, having a function of automatic focus adjustment (i.e., auto-focusing function) in a reduction projection exposure process wherein a circuit pattern of a reticle is repeatedly printed on the surface of a semiconductor wafer.

Further miniaturization in size and further enlargement in density of a pattern for a semiconductor device such as an LSI or a VLSI have required a projection exposure apparatus having an image (projection) optical system with a very high resolving power. This necessitates enlargement of the numerical aperture (NA) of an imaging optical system, which leads to shortness of the depth of focus of the imaging optical system.

As regards wafers, because of the flatness machining technique, they have dispersion in thickness and warp. Generally, as regards the wafer warp correction, a wafer is placed on a wafer chuck having its surface flatness finished at a submicron order, and then the bottom face of the wafer is vacuum-attracted to thereby perform the flatness correction. However, because of irregularity in thickness inside a single wafer or of an attraction method used, or as a result of execution of processes, deformation may be produced in the wafer. On that occasion, the wafer may have a surface irregularity within an exposure region where a reticle pattern is to be projected and printed in a reduced scale, and the effective depth of focus of the optical system will be reduced more.

In consideration of the above, an automatic focus adjusting method effective to bring a wafer surface in registration with a focal plane (image plane of a projection optical system) is a very important factor in a projection exposure apparatus.

Examples of a wafer surface position detecting method in a projection exposure apparatus are a method using an air micro-sensor, a method (optical method) wherein light is projected on a wafer surface long an oblique direction thereto without going through a projection optical system and a positional deviation of reflected light therefrom is detected, and a method called "Through The Lens Autofocus (TTLAF)" wherein a focal plane is detected through a projection optical system.

FIG. 15 is a schematic view of a projection exposure apparatus having an autofocusing function, such as disclosed in Japanese Laid-Open Patent Application, Laid-Open No. 286418/1989. Denoted in FIG. 15 at 107 is a reticle which is held by a reticle stage 170. A circuit pattern formed on the reticle 107 is imaged upon a wafer 109, placed on an X-Y-Z stage 110, by a reduction projection lens 108 in a reduced scale of 1/5, whereby wafer exposure is performed.

In FIG. 15, disposed adjacent to the wafer 109 is a reference flat mirror 117 which has a mirror surface placed substantially coplanar with the top face of the wafer 109. This reference flat mirror 117 is used for focusing and alignment operations. The X-Y-Z stage 110 is movable in an optical axis direction (Z) of the projection lens 108 and along a plane (X-Y) orthogonal to this direction. Also, it can be rotationally moved about the optical axis. As regards the reticle 107, a picture field region thereof through which the circuit pattern transfer is to be performed can be illuminated with an illumination optical system having components 101–106 shown in the drawing.

A light source for exposure comprises a Hg lamp 101 having its light emitting portion placed at the position of a first focal point of an elliptical mirror 102. Thus, the light emitted by the Hg lamp 101 is collected at a second focal point position of the elliptical mirror 102. An optical integrator 103 has its light entrance surface placed at the second focal point position of the elliptical mirror 102, such that secondary light sources are produced at a light exit surface of the optical integrator 103. The light from the optical integrator 103, defining the secondary light sources, goes through a condenser lens 104 and, by means of a mirror 105, the optical axis (light path) is deflected by 90 degrees. The exposure light thus reflected by the mirror 105 goes through a field lens 106 and it illuminates the picture field region on the reticle 107 through which the circuit pattern transfer is to be performed.

The mirror 105 has a structure for partially (e.g., 5–10%) transmitting the exposure light therethrough. The light passed through the mirror 105 goes through a filter 151 effective to transmit an exposure wavelength but to intercept light unnecessary for photoelectric detection, and then it impinges on a photodetector 150 which is provided to monitor fluctuation in quantity of the light from the light source, for example.

Those components shown at 111–112 in the drawing constitute an off-axis autofocus optical system of a known type. Denoted at 111 is a light projecting optical system which produces non-exposure light (non-sensitizing light). The light from the light projecting optical system is collected at a point on the reference flat mirror 117 (or upon the top face of the wafer 109) which intersects the optical axis of the reduction projection lens 108, and the light is reflected thereby. The light reflected by the reference flat mirror 117 enters a detection optical system 112. While not shown in the drawing, there is a position detecting light receiving element disposed inside the detection optical system 112. The light reflection point on the reference flat mirror 117 and the unshown position detecting light receiving element are disposed in an optically conjugate relation with each other, such that any positional deviation of the reference flat mirror 117 with respect to the optical axis direction of the reduction projection lens 108 can be measured as a positional shift of the incident light upon the light receiving element inside the detection optical system 112.

The positional deviation of the reference flat mirror 118 from a predetermined reference plane, as measured by the detection optical system 112, is transmitted to an autofocus control system 119. The autofocus control system 119 applies a signal, for movement in the Z direction, to a driving system 120 for driving the X-Y-Z stage 110 on which the reference flat mirror 117 is fixedly mounted. Also, when the focus position is detected in accordance with the TTL method, the autofocus control system 119 operates to move the reference flat mirror 117 upwardly or downwardly, in the neighborhood of the predetermined reference position, along the optical axis direction (Z direction) of the projection lens 108. Further, the autofocus control system 119 functions to perform position control for the wafer 109, in a practical exposure operation (to place the wafer 109 at the position of the reference flat mirror 117 shown in FIG. 15).

Next, a focus position detecting optical system for the reduction projection lens 108 will be described. In FIGS. 13 and 14, denoted at 107 is a reticle, and denoted at 121 are pattern portions formed on the reticle 107 and having a light blocking property. Denoted at 122 is a transmissive portion defined between the pattern portions 121. Here, for detection of the focus position (image plane position) of the reduction projection lens 108, the X-Y-Z stage 110 is moved along the optical axis direction of the reduction projection lens 108. Also, the reference flat mirror 117 is placed on the optical axis of the reduction projection lens 108, and the reticle 107 is illuminated with the illumination optical system (101–106) shown in FIG. 15.

First, a case where the reference flat mirror 117 is just positioned upon the focal plane of the reduction projection lens 108 will be explained, in conjunction with FIG. 13. The exposure light passing through the transmissive portion 122 of the reticle 107 goes through the reduction projection lens 108, and it is collected upon the reference flat mirror 117 by which the light is reflected. The exposure light thus reflected goes back along its on-coming light path and, after passing through the reduction projection lens 108, it is collected upon the reticle 107. The light passes through the transmissive portion 122 between the pattern portions 121 on the reticle 107. Here, the exposure light is not eclipsed by the pattern portion 121, and all the exposure light goes through the transmissive portion between the pattern portions 121.

Second, a case where the reference flat mirror 117 is placed at a position deviated from the focal plane of the reduction projection lens 108 will be explained, in conjunction with FIG. 14. The exposure light passing through the light transmissive portion between the pattern portions 121 of the reticle 107 goes through the reduction projection lens 108 and it impinges on the reference flat mirror 117. Since however the reference flat mirror 117 is not upon the focal plane of the reduction projection lens 108, the exposure light is reflected by the reference flat mirror 117 as light being expanded. Namely, the exposure light reflected goes along a light path different from its on-coming path. Thus, after passing through the reduction projection lens 108, it is not collected upon the reticle 107 but it impinges on the reticle 107 as light having expansion corresponding to the deviation of the reference flat mirror 117 from the focal plane of the reduction projection lens 108. Therefore, a portion of the exposure light is eclipsed by the pattern portion 121 of the reticle 107, such that all the exposure light does not pass through the transmissive portion 122. As a result, there occurs a difference in the quantity of reflection light, coming from the reticle, between the in-focus state and the out-of-focus state with respect to the focal plane.

The path of exposure light reflected by the reference flat mirror 117 and passed through the reticle 107 in FIG. 13 or 14, will be explained in conjunction with FIG. 15. The exposure light passing through the reticle 107 goes through the field lens 106 and then it impinges on the mirror 105. As described hereinbefore, the mirror 105 has a transmission factor of about 5–10% with respect to the exposure light. Therefore, a portion of the exposure light impinging on the mirror 105 goes therethrough and, after passing through an imaging lens 113, it is collected upon a plane of a field stop 114. Here, the field stop 114 and the surface of the reticle 107 on which the pattern is formed are placed in an optically conjugate relation. The exposure light passing through an aperture of the field stop 114 is directed by a condenser lens 115 to a light receiving element 116. Disposed in front of the light receiving element 116 is a filter 151 effective to selectively transmit only the exposure light, and an electric signal corresponding to the quantity of exposure light incident on the detector is produced.

On the basis of an output signal from the light receiving element 116, the focus position (image plane position) of the reduction projection lens 108 is detected as follows.

The X-Y-Z stage 110 on which the reference flat mirror 117 is mounted is moved by the driving system 120 along the optical axis direction of the reduction projection lens 108, about a zero point for measurement which can be preset through the detection optical system 112. FIG. 11 illustrates a relation between (i) a positional signal (autofocus measured value Z) related to the position of the reference flat mirror 117 in the optical axis direction, as measured through the detection optical system 112 with respect to different positions, and (ii) an output of a focal plane (image plane) detection system 118 produced in response to reception, by the light receiving element 116, of the exposure light reflected by the reference flat mirror 117 and in accordance with conversion of the received light into an electric signal. Here, in order to avoid the influence of fluctuation of the light source 101, the light from the light source 101 passing through the mirror 105 is directed through a light-source light quantity monitoring optical system (152, 151) and then is detected by a photodetector 150. Then, a reference light quantity detecting system 153 produces a light-source light quantity monitoring signal. By using this monitoring signal, the signal of the focal plane detecting system 118 is standardized and corrected.

As the reference flat mirror 117 is placed upon the focal plane of the reduction projection lens 108, the output of the focal plane detecting system 118 shows a peak value. The autofocus measured value $Z_0$ at that time is taken as the focus position of the reduction projection lens 108, for performing the exposure process to the wafer 109 through the projection lens 108. Alternatively, the preset focus position is corrected on the basis of the measured value $Z_0$.

A reference position for the off-axis autofocus optical system (110, 112, 119) is set to the focus position of the reduction projection lens 108 determined as described above. A best position for practical wafer printing may be a position obtainable by adding, to this reference position, a value corresponding to an offset according to a coating material thickness or a surface level (step) difference of a wafer, for example. In a case when a wafer is exposed by use of a multiple-layer resist process, only the topmost one of the multiple layers should be sensitized. Therefore, the wafer resist surface position may coincide with the reference position. If, on the other hand, a single-layer resist process is used and the exposure light can sufficiently reach the substrate, the focus of the wafer is registered with the substrate surface, not with the resist surface. On that occasion, therefore, there may be an offset of 1 micron or more between the resist surface and the reference position. Such an offset amount is peculiar to a process, and it should be applied independently of the projection exposure apparatus. As regards the exposure apparatus itself, it is sufficient that the focus position of the reduction projection lens 108 is detected accurately in the manner described hereinbefore. The offset amount described above may be applied to the autofocus control system 119 or to the driving system 120, as required, through a system controller (not shown) of the projection exposure apparatus.

While the detection of the focus position $Z_0$ may be determined on the basis of a peak of the output of the focal plane detecting system 118, any other methods may be used. For example, in order to provide an increased detection sensitivity, a slice level SL (FIG. 11) of a certain proportion to the peak output may be set and, on the basis of autofocus measured values $Z_1$ and $Z_2$ where the output level is at the slice level SL, the focus position may be determined as:

$$Z_0=(Z_1+Z_2)/2.$$

Alternatively, the peak position may be determined in accordance with a differentiation method.

An advantage of the TTL autofocus system shown in FIG. 15 is that a change in temperature surrounding the projection exposure optical system, a change in atmospheric pressure, a temperature rise of the projection optical system due to exposure light, and a change in focus with time resulting from the temperature rise, can be measured continuously and thus can be corrected continuously.

In an automatic focusing method (TTLAF method) using such an autofocus detecting system, generally, the position of a detection mark which is to be provided on an original for detection of a best image plane position of a projection optical system is fixed at a certain location outside an actual device region and at a predetermined image height, rather than being variable with originals used. Namely, the measurement of a best image plane position is performed at a fixed image height position. Therefore, the X-Y position of a reference surface (reference flat mirror surface) where a reference mark to be measured by the position detecting system is fixedly placed at a constant position. Consequently, the state of the surface shape of the reference surface such as any surface irregularities or tilt thereof, does not raise a specific problem. They may be taken into consideration as an initial offset of a constant amount.

SUMMARY OF THE INVENTION

Usually, the transfer characteristic of a projection lens is best at an optical axis thereof. Therefore, as regards the position of a detecting mark to be provided on an original for detection of a best image plane position, it may desirably be placed at a position close to an actual device pattern region.

It is accordingly a first object of the present invention to provide a position detecting method and/or a position detecting system by which surface detection can be accomplished appropriately even in a case where detection of surface registration should be performed at different positions, that is, for example, a case where the position of a detecting mark to be provided on an original for an autofocus detecting system varies with different originals.

It is a second object of the present invention to provide a projection exposure method, a projection exposure apparatus and/or a device manufacturing method by which, in accordance with determination of an error in a detected value produced through surface detection at an arbitrary position, detection of an optimum surface position can be accomplished stably and production of a large-integration device can be facilitated.

In accordance with an aspect of the present invention, there is provided a position detecting method for detecting a position of a surface of an object, said method comprising: a first step for detecting registration of the object surface with a predetermined plane with respect to a first direction, while changing the position of the object surface in a direction intersecting with the first direction; and a second step for detecting the position of the object surface in the first direction.

In one preferred form of this aspect of the present invention, a detection value corresponding to the predetermined plane in the second step is determined by use of an error in a result of detection made with reference to the predetermined plane, which is attributable to a difference in detection position upon the same object surface in the first and second steps.

An error in the result of detection made with reference to the predetermined plane may be produced due to a tilt of the predetermined plane with respect to a direction perpendicular to the first direction.

The error in the result of detection made with reference to the predetermined plane may be produced due to a shape of the object surface.

The error in the result of detection made with reference to the predetermined plane may be produced due to a shift of the object surface in a direction intersecting with the first direction.

The error in the result of detection made with reference to the predetermined plane may concern at least an error which is produced due to one of a shape of the object surface and a shift of the object surface in a direction intersecting with the first direction.

In accordance with another aspect of the present invention, there is provided a position detecting system for detecting a position of a surface of an object, comprising: a first detecting system for detecting registration of the object surface with a predetermined plane with respect to a first direction; a second detecting system for detecting the position of the object surface in the first direction; and determining means for determining a detection value of said second detecting system, corresponding to the predetermined plane, by use of an error in the result of detection made with reference to the predetermined plane, which is attributable to a difference in detection position upon the same object surface in said first and second detecting systems.

In one preferred form of this aspect of the present invention, an error in the result of detection made with reference to the predetermined plane may be produced due to a tilt of the predetermined plane with respect to a direction perpendicular to the first direction.

The error in the result of detection made with reference to the predetermined plane may be produced due to a shape of the object surface.

The error in the result of detection made with reference to the predetermined plane may be produced due to a shift of the object surface in a direction intersecting with the first direction.

The error in the result of detection made with reference to the predetermined plane may concern at least an error which is produced due to one of a shape of the object surface and a shift of the object surface in a direction intersecting with the first direction.

The detection value may be determined on the basis of (i) a quantity of change in shape of the object surface, as the object is moved in a direction intersecting with the first direction so that the position of a mark on the object surface is shifted from an on-axis position where the position detection is to be made through said second detecting system to a position where registration of the object surface with the predetermined plane is to be detected through said first detecting system, (ii) a quantity of shift in the first direction due to a tilt of the predetermined plane with respect to a tilt direction of the object surface itself, and (iii) a measured value of said second detecting system produced at a position where registration of the mark with the predetermined plane is detected through said first detecting system.

When the position detection for the object surface is repeated, a quantity of change in shape of the object surface may be detected only in a first-time detecting operation, and, in a detecting operation or operations following the first-time detecting operation, the detection value may be determined by reflecting the quantity of change in shape of the object surface detected by the first-time detecting operation to a measured value or values of said second detecting system obtained in a state where the mark is registered with the predetermined plane, and the quantity of shift in the first direction due to a tilt of the predetermined plane with respect to a tilt direction of the object surface itself.

When the position for detecting registration of the object surface with the predetermined plane through said first detecting system is variable, amounts of changes in shape of the object surface corresponding to different positions may be detected beforehand and may be stored into a storing system, and when the position detection for the object surface is repeated, the detection value may be determined by reflecting a corresponding quantity of change in shape of the object surface to a measured value of said second detecting system obtained in a state where the mark is registered with the predetermined plane, and the quantity of shift in the first direction due to a tilt of the predetermined plane with respect to a tilt direction of the object surface itself.

The detection value may be determined on the basis of (i) a quantity of change in a measured value of said second detecting system due to the shape of the object surface, as the object is moved in a direction intersecting with the first direction so that the position of a mark on the object surface is shifted from an on-axis position where the position detection is to be made through said second detecting system to a position where registration of the object surface with the predetermined plane is to be detected through said first detecting system, (ii) a quantity of shift in the first direction due to a tilt of the predetermined plane with respect to the movement direction of the object, and (iii) a measured value of said second detecting system produced at a position where registration of the mark with the predetermined plane is detected through said first detecting system.

The detection value may be determined on the basis of (i) a measured value on the mark by said second detecting system, as the object is moved in a direction intersecting with the first direction so that the position of a mark on the object surface is shifted from a position where registration of the object surface with the predetermined plane is to be detected through said first detecting system, to an on-axis position where the position detection is to be made through said second detecting system, and (ii) a quantity of shift in the first direction due to a tilt of the predetermined plane with respect to a movement direction of the object.

In accordance with a further aspect of the present invention, there is provided a projection exposure method for exposing a workpiece by use of a projection optical system, said method comprising: a first detecting step for detecting, when an in-focus detecting system for detecting a reference mark provided on a reference surface of a movable stage and an in-focus state of the reference mark with reference to an image plane of the projection optical system and with respect to an optical axis direction of the projection optical system is deviated from the optical axis, the in-focus state by use of the in-focus detecting system; and a second detecting step for detecting a position of the reference plane by use of a position detecting system for detecting a position of the reference plane with respect to the optical axis direction.

In one preferred form of this aspect of the present invention, a detection value corresponding to the image plane in the second detecting step may be determined by use of an error in the result of detection made with reference to the image plane, which is attributable to a difference in detection position upon the same reference surface in the first and second detecting steps.

An error in the result of detection made with reference to the image plane may be produced due to a tilt of the image plane with respect to a direction perpendicular to the optical axis direction.

The error in the result of detection made with reference to the image plane may be produced due to a shape of the reference surface.

The error in the result of detection made with reference to the image plane may be produced due to a shift of the movable stage in a direction intersecting with the optical axis direction.

The error in the result of detection made with reference to the image plane may concern at least an error which is produced due to one of a shape of the reference surface and a shift of the movable stage in a direction intersecting with the optical axis direction.

In accordance with a yet further aspect of the present invention, there is provided a projection exposure apparatus for exposing a workpiece by use of a projection optical system, comprising: a movable stage for supporting the workpiece; a reference surface provided on said movable stage; a reference mark provided on said reference surface; an in-focus detecting system for detecting an in-focus state of the reference mark with reference to an image plane of the projection optical system and with respect to an optical axis direction of the projection optical system; a position detecting system for detecting a position of the reference surface with respect to the optical axis direction; and determining means for determining a detection value corresponding to the image plane of said position detecting system, by use of an error in the result of detection made with reference to the image plane, which is attributable to a difference in detection position upon the same reference surface by said in-focus detecting system and said position detecting system.

In one preferred form of this aspect of the present invention, an error in the result of detection made with reference to the image plane is produced due to a tilt of the image plane with respect to a direction perpendicular to the optical axis direction.

The error in the result of detection made with reference to the image plane may be produced due to a shape of the reference surface.

The error in the result of detection made with reference to the image plane may be produced due to movement of said movable stage in a direction intersecting with the optical axis direction.

The error in the result of detection made with reference to the image plane may concern at least an error which is produced due to one of a shape of the reference surface and movement of said movable stage in a direction intersecting with the optical axis direction.

The detection value may be determined on the basis of (i) a quantity of change in shape of the reference surface, as said movable stage is moved in a direction intersecting with the optical axis direction so that the position of the reference mark is shifted from the on-axis position to a position where the in-focus is to be detected, (ii) a quantity of shift in the optical axis direction due to a tilt of the image plane with respect to a tilt direction of the reference surface itself, and (iii) a measured value of said position detecting system produced at a position where in-focus of the reference mark is detected through said in-focus detecting system.

During execution of an actual process exposure, a quantity of change in shape of the reference surface may be detected only in a first-time detecting operation, and, in a detecting operation or operations following the first-time detecting operation, the detection value may be determined by reflecting the quantity of change in shape of the reference surface detected by the first-time detecting operation to a measured value or values of said position detecting system obtained in the in-focus state, and the quantity of shift in the optical axis direction due to a tilt of the image plane with respect to a tilt direction of the reference surface itself.

The amounts of changes in shape of the reference surface corresponding to different positions where measurements by said in-focus detecting system are to be performed may be detected beforehand and may be stored into a storing system, and, during execution of an actual process exposure, the detection value may be determined by reflecting a corresponding quantity of change in shape of the reference surface to a measured value of said position detecting system obtained in the in-focus state, and the quantity of shift in the optical axis direction due to a tilt of the image plane with respect to a tilt direction of the reference surface itself.

The detection value may be determined on the basis of (i) a quantity of change in a measured value of said position detecting system due to the shape of the reference surface, as said movable stage is moved in a direction intersecting with the optical axis direction so that the position of the reference mark is shifted from the on-axis position to a position for detection of the in-focus, (ii) a quantity of shift in the optical axis direction due to a tilt of the image plane with respect to the movement direction of said stage, and (iii) a measured value of said position detecting system produced at a position where an in-focus state of the reference mark is detected through said in-focus detecting system.

The detection value may be determined on the basis of (i) a measured value on the reference mark by said position detecting system, as said movable stage is moved in a direction intersecting with the optical axis direction so that the position of the reference mark is shifted from a position where an in-focus state is to be detected through said in-focus detecting system, to an on-axis position, and (ii) a quantity of shift in the optical axis direction due to a tilt of the image plane with respect to a movement direction of said movable stage.

In accordance with a still further aspect of the present invention, there is provided a device manufacturing method wherein a workpiece is exposed by use of a projection optical system and then is treated by a development process, for production of a device, said method comprising: an in-focus state detecting step for detecting an in-focus state of a reference mark, provided on a reference surface on a movable stage, with reference to an image plane of the projection optical system and with respect to an optical axis direction of the projection optical system; a position detecting step for detecting the position of the reference surface in the optical axis direction; and a determining step for determining a detection value corresponding to the image plane to be detected by said position detecting step, by use of an error in the result of detection made with reference to the image plane, which is attributable to a difference in detection position upon the same reference surface in said position detecting step and said in-focus state detecting step.

In one preferred form of this aspect of the present invention, an error in the result of detection made with reference to the image plane is produced due to a tilt of the image plane with respect to a direction perpendicular to the optical axis direction.

The error in the result of detection made with reference to the image plane may be produced due to a shape of the reference surface.

The error in the result of detection made with reference to the image plane may be produced due to movement of the movable stage in a direction intersecting with the optical axis direction.

The error in the result of detection made with reference to the image plane may concern at least an error which is produced due to one of a shape of the reference surface and movement of the movable stage in a direction intersecting with the optical axis direction.

The detection value may be determined on the basis of (i) a quantity of change in shape of the reference surface, as the movable stage is moved in a direction intersecting with the optical axis direction so that the position of the reference mark is shifted from the on-axis position to a position where said in-focus state detecting step is to be executed, (ii) a quantity of shift in the optical axis direction due to a tilt of the image plane with respect to a tilt direction of the reference surface itself, and (iii) a measured value in said position detecting step executed at a position where in-focus of the reference mark is detected through said in-focus state detecting step.

During execution of an actual process exposure, a quantity of change in shape of the reference surface may be detected only in a first-time detecting operation, and, in a detecting operation or operations following the first-time detecting operation, the detection value may be determined by reflecting the quantity of change in shape of the reference surface detected by the first-time detecting operation to a measured value through said position detecting step executed in the in-focus state, and the quantity of shift in the optical axis direction due to a tilt of the image plane with respect to a tilt direction of the reference surface itself.

The amounts of changes in shape of the reference surface corresponding to different positions where measurements by said in-focus state detecting step are to be performed may be detected beforehand and may be stored into a storing system, and, during execution of an actual process exposure, the detection value may be determined by reflecting a corresponding quantity of change in shape of the reference surface to a measured value of said position detecting step executed in the in-focus state, and the quantity of shift in the optical axis direction due to a tilt of the image plane with respect to a tilt direction of the reference surface itself.

The detection value may be determined on the basis of (i) a quantity of change in a measured value detected in said position detecting step, due to the shape of the reference surface, as the movable stage is moved in a direction intersecting with the optical axis direction so that the position of the reference mark is shifted from the on-axis position to a position for detection of the in-focus, (ii) a quantity of shift in the optical axis direction due to a tilt of the image plane with respect to the movement direction of said stage, and (iii) a measured value of said position detecting step produced at a position where an in-focus state of the reference mark is detected through said in-focus state detecting step.

The detection value may be determined on the basis of (i) a measured value on the reference mark detected by said position detecting step, as the movable stage is moved in a direction intersecting with the optical axis direction so that the position of the reference mark is shifted from a position where an in-focus state is to be detected through said in-focus state detecting step, to an on-axis position, and (ii) a quantity of shift in the optical axis direction due to a tilt of the image plane with respect to a movement direction of said movable stage.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the accompanying drawings.

[Embodiment 1]

Figure 8:
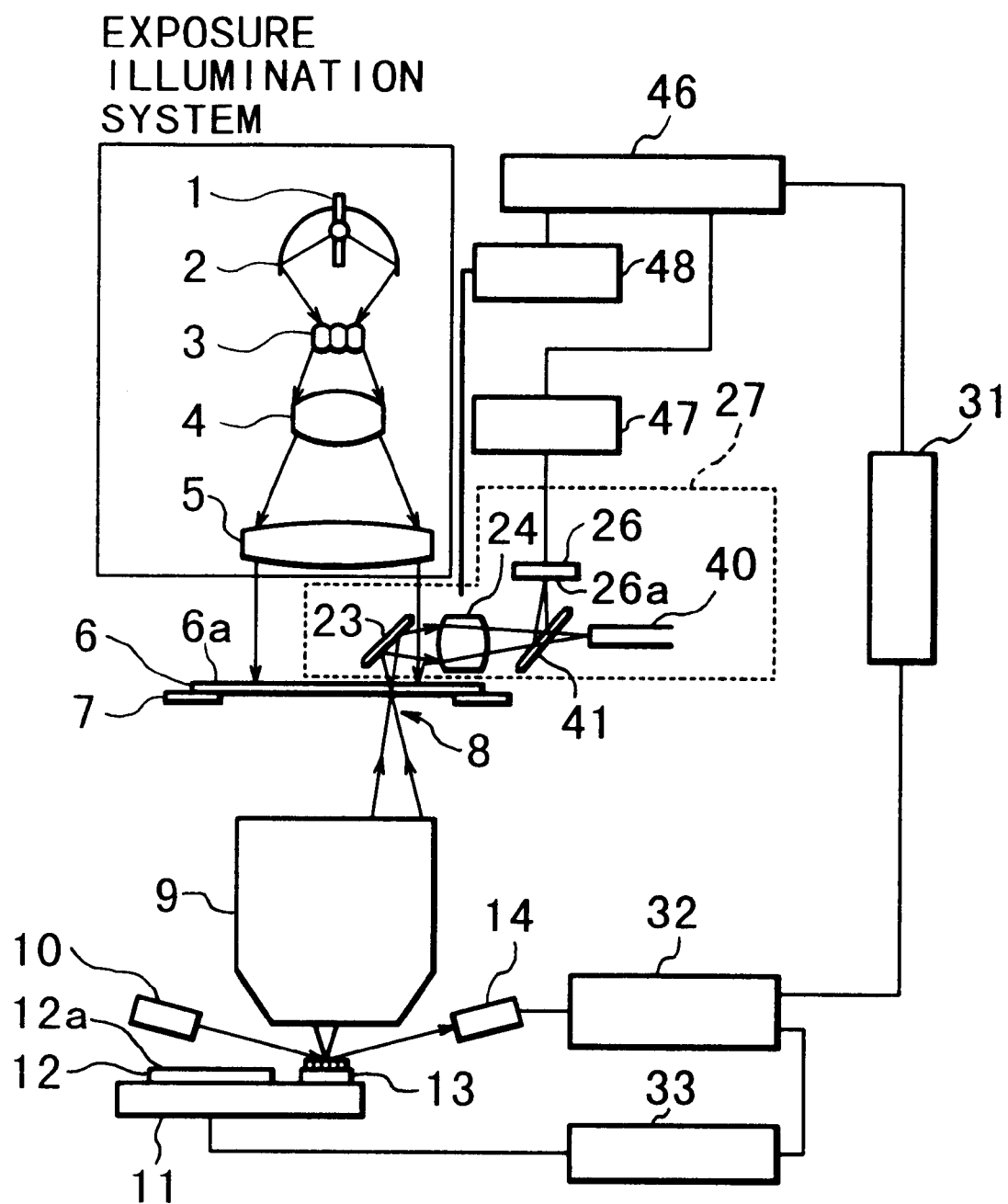
FIG. 8 is a schematic view of a main portion of a projection exposure apparatus according to an embodiment of the present invention.

FIG. 8 is a schematic view of an embodiment of the present invention, and it shows a general structure of a projection exposure apparatus having an automatic focusing function (based on the TTLAF method in this example) to be used with an in-focus state detecting system and a reference surface (corresponding to the reference flat mirror) provided on a movable stage (corresponding to the X-Y-Z stage).

Denoted in FIG. 8 at 6 is a reticle which is held by a reticle stage 7. A circuit pattern formed on the reticle 6 is imaged upon a wafer 12, placed on an X-Y-Z stage 11, by a projection lens 9 in a reduced scale of 1/5 or 1/2, whereby wafer exposure is performed.

Figure 9:
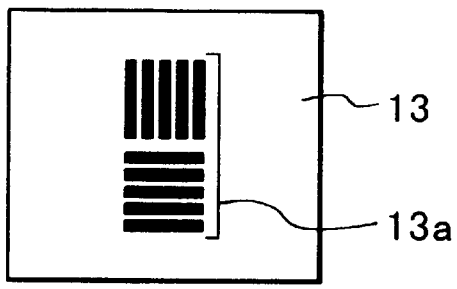
FIG. 9 is a schematic view for explaining a reference mark.
Figure 10:
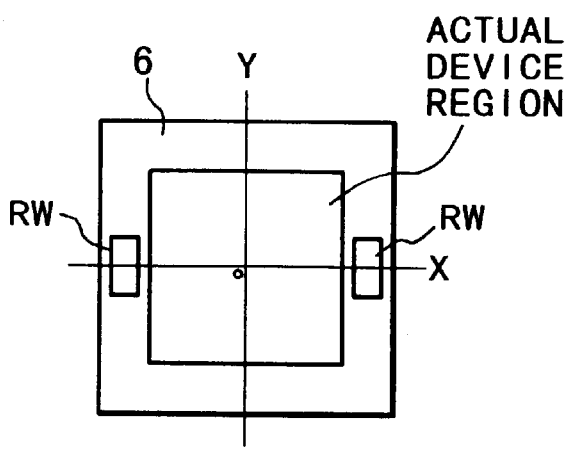
FIG. 10 is a schematic view for explaining a reticle used in the embodiment of FIG. 8.
Figure 11:
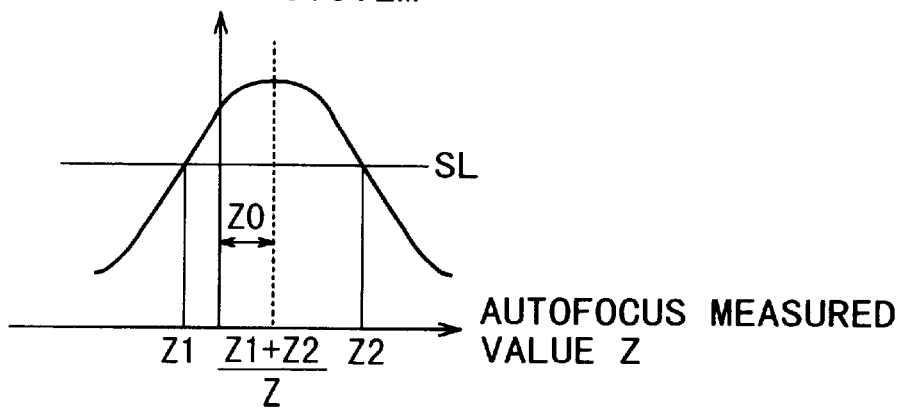
FIG. 11 is a graph for explaining an autofocus signal waveform.

In FIG. 8, disposed adjacent to the wafer 12 is a reference flat mirror 13 which has a mirror surface placed substantially coplanar with the top face of the wafer 12. As shown in FIG. 9, the reference flat mirror is formed with a reference mark 13a. The X-Y-Z stage 11 is movable in an optical axis direction (Z) of the projection lens 9 and along a plane (X-Y) orthogonal to this direction. Also, it can rotationally moved about the optical axis.

As regards the reticle 6, a picture field region thereof through which the circuit pattern transfer is to be performed can be illuminated with an illumination optical system having components 1–5 shown in the drawing.

A light source for exposure comprises a Hg lamp 1 having its light emitting portion placed at the position of a first focal point of an elliptical mirror 2. Thus, the light emitted by the Hg lamp 1 is collected at a second focal point position of the elliptical mirror 2. An optical integrator (fly's eye lens) 3 has its light entrance surface placed at the second focal point position of the elliptical mirror 2, such that secondary light sources are produced at a light exit surface of the optical integrator 3. The light from the optical integrator 3, defining the secondary light sources, goes through an illumination lens 4 and a field lens 5, and it illuminates the reticle 6.

Figure 15:
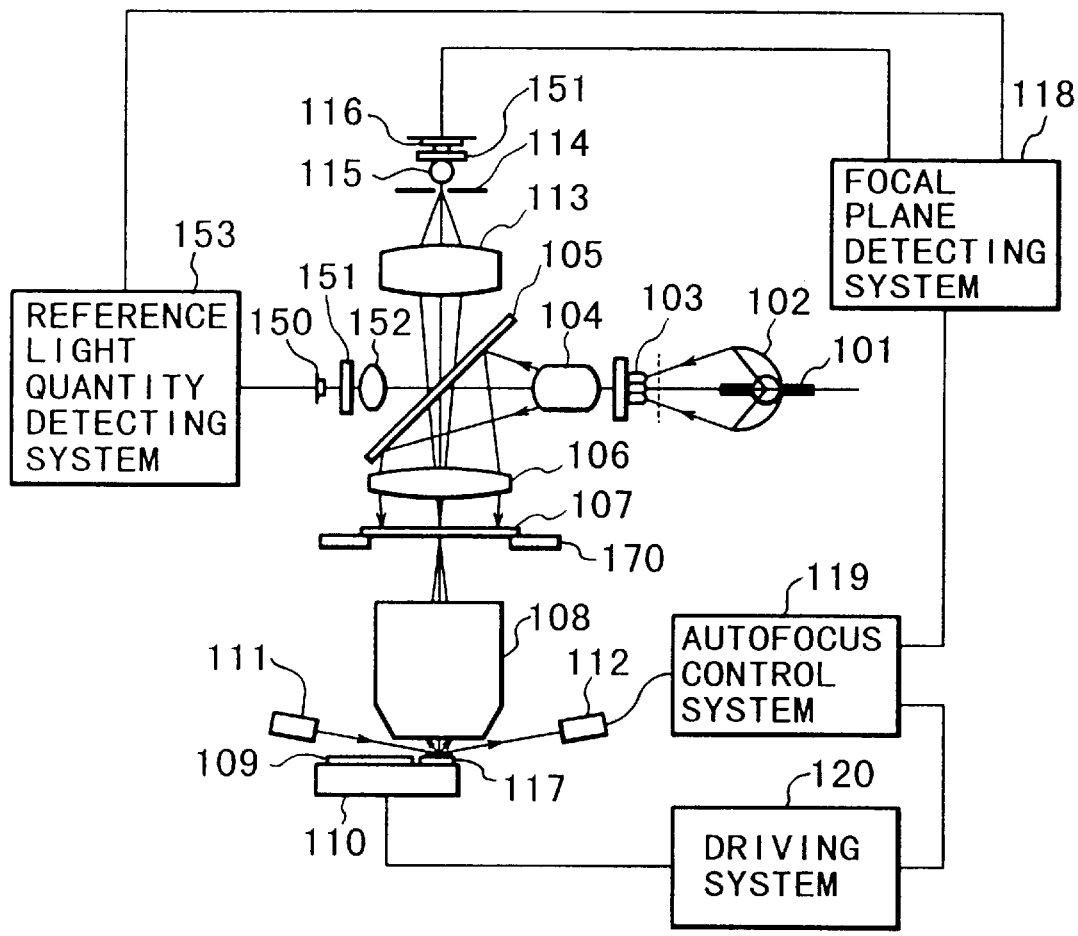
FIG. 15 is a schematic view of a projection exposure apparatus of a known type, to be described with reference to FIGS. 13 and 14.

Those components shown at 10, 13 and 14 in the drawing constitute a position detecting system (off-axis autofocus optical system, in this example) similar to that having been described with reference to FIG. 15. Denoted at 10 is a light projecting optical system which produces non-exposure light (non-sensitizing light). The light from the light projecting optical system 10 is collected at a point on the reference flat mirror 13 (or upon the top face of the wafer 12), and the light is reflected thereby. The light reflected by the reference flat mirror 13 enters a focus detection optical system 14. While not shown in the drawing, there is a position detecting light receiving element disposed inside the focus detection optical system 14. The light reflection point on the reference flat mirror 13 and the unshown position detecting light receiving element are disposed in an optically conjugate relation with each other.

Any positional deviation of the reference flat mirror 13 with respect to the optical axis direction of the reduction projection lens 9 can be measured as a positional shift of the incident light upon the light receiving element inside the focus detection optical system 14.

The positional deviation of the reference flat mirror 13 from a predetermined reference plane, as measured by the focus detection optical system 14, is transmitted to an autofocus control system 32. The autofocus control system 32 applies a signal, for movement in the Z direction, to a driving system 33 for driving the X-Y-Z stage 11 on which the reference flat mirror 13 is fixedly mounted. Also, when the image plane position (focus position) is to be detected in accordance with the TTL method and through an in-focus detecting system (corresponding to a focal plane detecting optical system, in this example), the autofocus control system 32 operates to move the reference flat mirror 13 upwardly or downwardly, in the neighborhood of the predetermined reference position, along the optical axis direction (Z direction) of the projection lens 9. Further, the autofocus control system 32 functions to perform position control for the wafer 12, in a practical exposure operation (to place the wafer 12 at the position of the reference flat mirror 13 shown in FIG. 8).

Next, constitutional elements in this embodiment for detecting a focus position of the projection lens 9, on the basis of detecting the state of focus of the wafer 12 surface and of moving the X-Y-Z stage 11 in accordance with a corresponding signal, will be explained.

Figure 12:
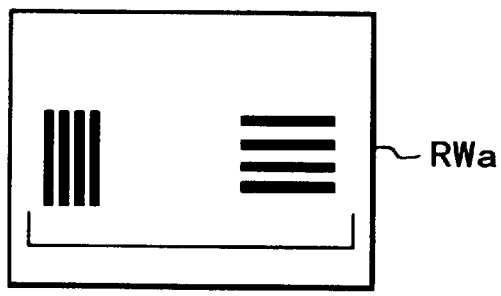
FIG. 12 is a schematic view for explaining a detection mark which is provided on a reticle.
Figure 13:
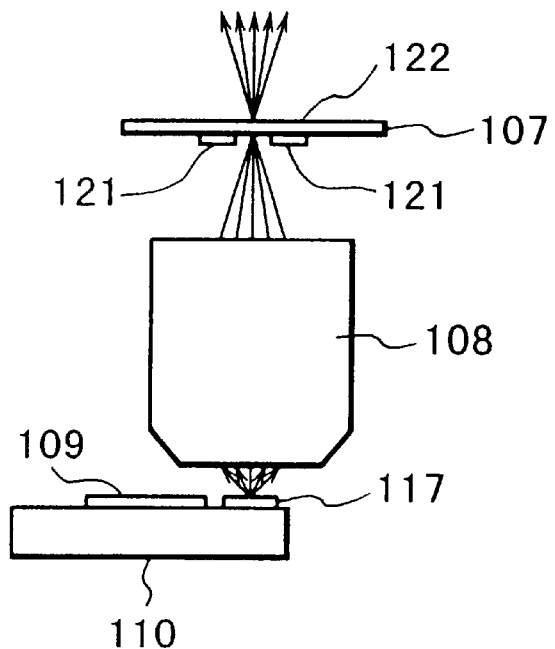
FIGS. 13 and 14 are enlarged views, respectively, for explaining a portion of a projection exposure apparatus of a known type.
Figure 14:
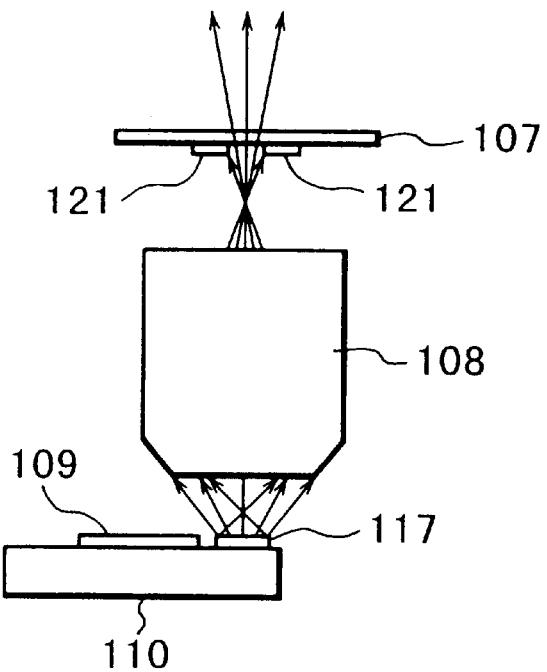

Denoted at 27 is a focal plane detecting optical system based on the TTLAF method. It comprises components 23, 24, 26, 40 and 41 to be described below. A fiber 40 emits illumination light which passes through a half mirror 41, and it advances via an objective lens 24 and a mirror 23. Then, it is collected in the neighborhood of the reticle 6. The reticle 6 has formed thereon a transmissive area (open window) 8 of a predetermined size, at an arbitrary position RW outside an actual device region. There, a detection mark RWa for focus detection is formed in relation to the reticle 6 surface, which mark comprises, as shown in FIG. 12, a line-and-space pattern of a predetermined linewidth and extending laterally and longitudinally. The detection mark RWa is so disposed that, when it is observed through the focal plane detecting optical system 27, the reflection light from the reference mark is not obstructed. The illumination light, passing this window portion 8, goes through a projection lens 9 and then it is collected on the reference flat mirror 13.

As described hereinbefore, the reference flat mirror 13 has formed on its surface a reference mark 13a such as shown in FIG. 9. The reflection light from the reference flat mirror 13 goes back along its on-coming light path, and is directed through or via the projection lens 9, the window portion 8, a mirror 23 and an objective lens 24, in this order. Subsequently, the light is reflected by the half mirror 41 toward a position sensor 26. The reference flat mirror 13 is mounted on the X-Y-Z stage 11, like the wafer 12, and it is held fixed on a focal plane approximately coplanar with the wafer 12. The focus positions of the wafer surface 12a and the reference mark 13a surface (or the focus offset amount between them) is controlled by the autofocus control system 32. Thus, by execution of focusing with respect to the reference flat mirror 13 and by applying a predetermined offset amount, the focusing of an actual wafer can be performed automatically.

As shown in FIG. 9, the reference mark 13a formed on the reference flat mirror 13 comprises a line-and-space pattern of a predetermined linewidth and extending laterally and longitudinally. Light emitted from the reference mark 13a on the reference flat mirror 13 goes back along its on-coming path (return path), and it enters the objective lens 24. The light passing through the objective lens 24 is, now, reflected by the half mirror 41, and it is imaged upon the sensor surface 26a of the position sensor 26. This position sensor 26 may comprise either a one-dimensional (linear) array sensor or a two-dimensional (area) array sensor as represented by a CCD. For example, when focus detection to a monodirectional pattern (comprising only lateral or longitudinal linear elements) is sufficient in connection with the reference mark 13a (FIG. 9), use of a one-dimensional array sensor will be enough. When focus detection to a dual-directional pattern (comprising lateral and longitudinal linear elements) is necessary, a two-dimensional array sensor may be used. As the reference flat mirror 13 shifts in the optical axis direction of the projection lens 9, corresponding information with the focus state of the reference mark 13a (FIG. 9) changed accordingly will be produced upon the position sensor 26. On the basis of this, a best or optimum focus position can be determined.

As described hereinbefore, generally, the transfer characteristic of a projection lens is best on the optical axis. Thus, the position of a detection mark to be provided on a reticle for detection of the optimum image plane position should preferably be closest to an actual device pattern region. In consideration of it, in this embodiment, the focal plane detecting optical system 27 is made movable to enable detection of the image plane position, even when the detection mark is provided at any position.

On the other hand, if a plurality of reticles 6 have formed thereon detection marks RWa for autofocus measurement, which marks are placed at positions different from each other in accordance with circuit patterns formed on the reticles, the position of the reference flat mirror 13 with which the focus detecting optical system 14 performs the measurement differs with the reticles. On that occasion, any influences of the state of shape of the reference flat mirror 13, a tilt of the movement plane as the X-Y-Z stage 11 is driven or a difference in location on the image plane of the projection optical system 9, will be reflected to an autofocus measured value, thus causing a measurement error. In consideration of this, an error in a TTL autofocus detection value to be produced as a result of the state of shape of the reference flat mirror 13, any tilt of the movement plane of the X-Y-Z stage 11, or any tilt of the image plane of the projection optical system 9, is determined and, on the basis of which, a best focus position is determined. Details of the process will be described below.

Figure 1:
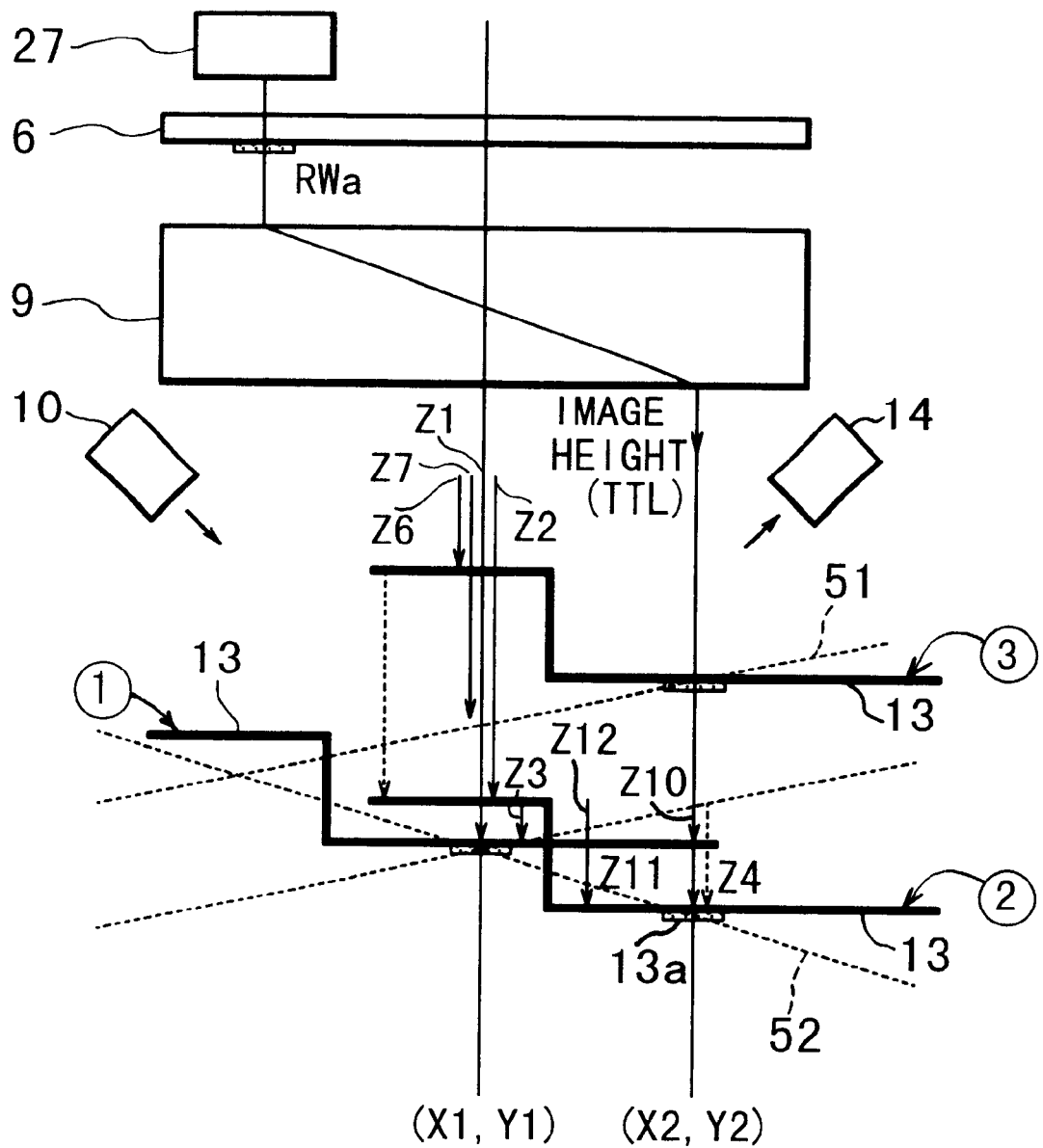
FIG. 1 is a schematic view of an autofocus detection system according to a first embodiment of the present invention.
Figure 2:
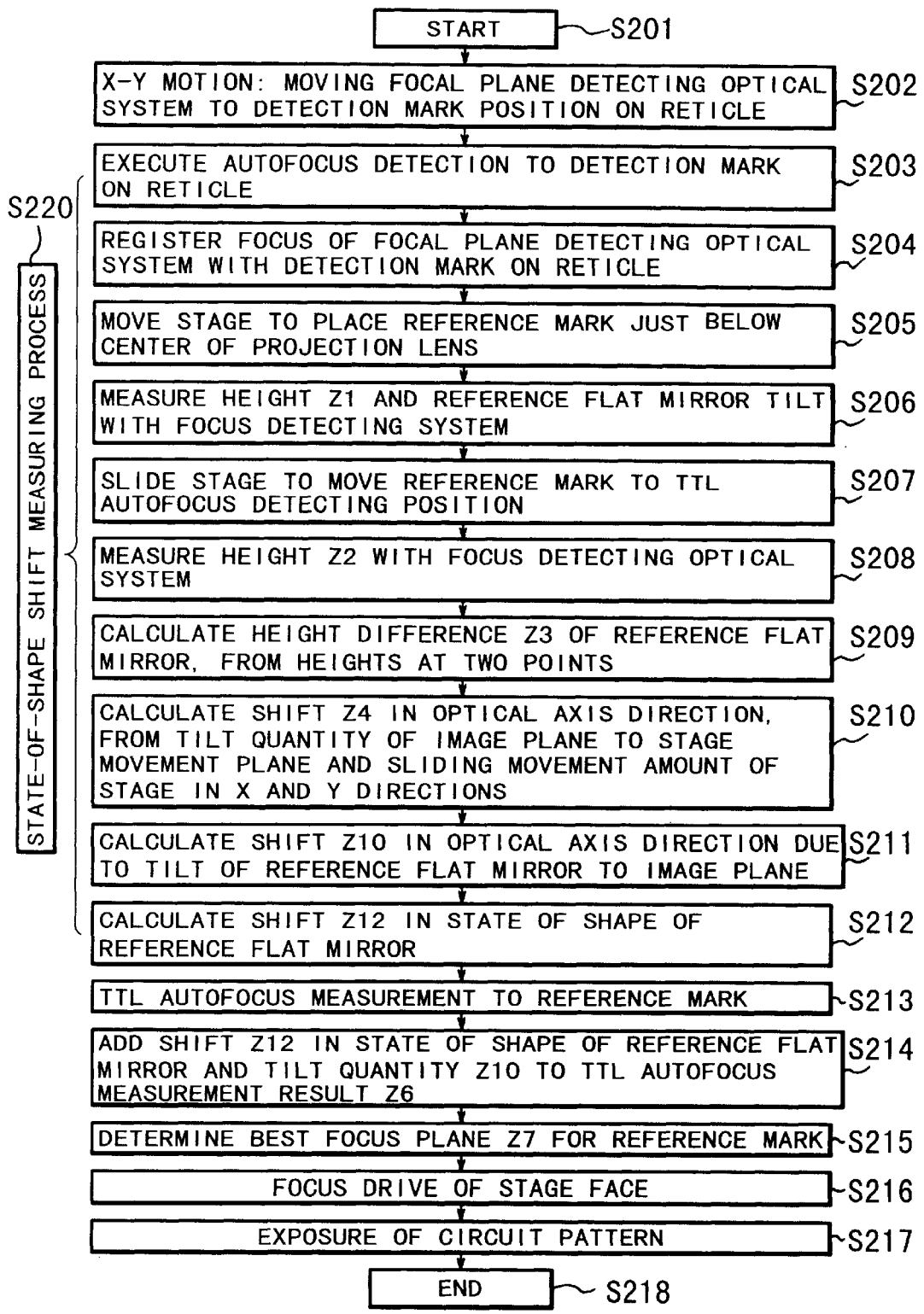
FIG. 2 is a flow chart of sequential operations for autofocus detection, in the first embodiment of the present invention.

FIG. 1 is a schematic view for explaining an autofocus detection process according to an embodiment of the present invention, and FIG. 2 is a flow chart of sequential operations for autofocus detection, in this embodiment of the present invention.

While details will be described below, those reference characters $Z_1$–$Z_{12}$ are assigned in FIG. 1, as follows:

$Z_1$: the height of the mirror surface as the reference mark is on the optical axis;

$Z_2$: the height of the mirror surface as the reference mark is at the measurement image height;

$Z_3$: the difference in height of the reference flat mirror to be produced as the stage is moved slidingly;

$Z_4$: the amount of shift in the optical axis direction due to a tilt of the image plane with respect to the stage movement plane, to be produced as the stage is moved slidingly;

$Z_6$: a measured value (before correction) in the TTLAF measurement;

$Z_7$: a measured value (after correction) in the TTLAF measurement;

$Z_{10}$: the tilt of the mirror surface with respect to the image plane;

$Z_{11}$: the tilt of the mirror surface with respect of the image plane; and $Z_{12}$: the amount of change in the state of shape of the reference flat mirror.

Also, there are the following relations:

$$Z_3 = Z_2 - Z_1$$

$$Z_{11} = Z_4 - Z_{10}$$

$$Z_{12} = Z_3 + Z_{11}$$

$$Z_7 = Z_6 + Z_{10} + Z_{12}$$

$$Z_7 = Z_6 + Z_{10} + Z_3 + Z_4 - Z_{10}$$

$$Z_7 = Z_6 + Z_3 + Z_4$$

$$Z_7 = Z_6 + Z_{10} + Z_{12}.$$

In FIG. 1, initially, the focal plane detecting optical system 27 is moved to the position of a detection mark RWa provided on the reticle 6 surface (that is, it is moved to a measurement image height position) (S202). The light from the fiber 40 is projected onto the reticle 6 surface, and, while detecting the reflection light therefrom through the position sensor 26, the focus adjustment is performed. By detecting the highest position in light quantity or contrast, the focus of the focal plane detecting optical system 27 is brought into registration with the detection mark RWa (S203 and S204). This is to avoid a measurement error factor such as warp of the reticle or crook of the driving system to be produced by movement of the focal plane detecting optical system 27.

Subsequently, in order to measure the amount of change in the state of shape of the reference flat mirror 13, measurement of the height of the reference flat mirror 13 as well as measurement of the tilt of the reference flat mirror 13 with respect to the image plane, as the reference mark 13a and the stage are moved so that the reference mark 13a is displaced to a position for observation of the focal plane detecting optical system, are performed. First, for measurement of the height of the reference mark 13a itself and the tilt of the reference flat mirror 13 with respect to the image plane, the X-Y-Z stage 11 is driven to place the reference mark 13a at a position $(X_1, Y_1)$ just below the center of the projection lens 9, namely, in the measurement region of the focus detecting optical system 14 (S205). Then, by using the focus detecting optical system 14, the height $Z_1$ of the reference mirror 13a is measured. Simultaneously, by using the focus detecting optical system 14, any tilt of the reference flat mirror 13 with respect to the image plane is measured (S206). The light projecting optical system 11 is arranged to produce five light fluxes, such that, by comparing detected values of the focus detecting optical system 14 corresponding to five locations upon the reference flat mirror 13 with each other, any tilt of the reference flat mirror 13 can be measured.

Subsequently, the reference mark 13a is moved by X-Y sliding motion to a position $(X_2, Y_2)$ where the focal plane detecting optical system 27 can be observed through the detection mark RWa which is provided on the reticle 6 surface (S207). The height $Z_2$ of the reference flat mirror 13 as can be measured at that time by the focus detecting optical system 14 is measured (S208).

Then, from the heights at two points, that is, the point for measurement of the height $Z_1$ of the reference mark 13a itself (which provides a reference height) and the point for measurement of the height $Z_2$ of the reference flat mirror 13 which is variable continuously with a change in measurement image height, the difference $Z_3$ in height of the reference flat mirror 13 to be produced due to the X-Y sliding motion of the reference mark 13a can be calculated (S209), as follows:

$$Z_3 = Z_2 - Z_1.$$

Then, the amount of shift $Z_4$ in the optical axis direction due to the tilt quantity of the image plane with respect to the stage movement plane 52, is detected. Since the tilt quantity $(T_X, T_Y)$ of the image plane 51 with respect to the movement plane 52 of the X-Y-Z stage 11 can be measured beforehand and stored into the apparatus, by using the driving amount through which the X-Y-Z stage 11 is slidingly removed in X and Y directions, that is, by using:

$$X_3 = X_2 - X_1$$

$$Y_3 = Y_2 - Y_1,$$

the amount of $Z_4$ of shift of the X-Y-Z stage 11 made at that time in the optical axis direction can be determined (S210), as follows:

$$Z_4 = T_X \times X_3 + T_Y \times X_3.$$

Similarly, from the tilt of the reference flat mirror 13 with respect to the image plane and the amount $(X_3, Y_3)$ of sliding motion of the X-Y-Z stage 11 in the X and Y directions, having been detected as described above, the amount of shift $Z_{10}$ in the optical axis direction due to the tilt of the reference flat mirror 13 with respect to the image plane can be determined (S211).

By using the values $Z_4$ and $Z_{10}$ obtained as described above, the amount of shift $Z_{11}$ in the optical axis direction due to the tilt of the reference flat mirror 13 with respect to the stage movement plane can be calculated, as follows:

$$Z_{11} = Z_4 - Z_{10}.$$

By using the values $Z_3$ and $Z_{11}$ obtained as described above, the amount of change $Z_{12}$ in the state of shape of the reference flat mirror 13 can be calculated (S211), as follows:

$$Z_{12} = Z_3 + Z_{11}.$$

In the manner described above, prior to the autofocus detection, the amount of change $Z_{12}$ in the state of shape of the reference flat mirror 13 at the measurement image height, is detected.

Thereafter, the TTL autofocus measurement (S213) described hereinbefore is performed. To the thus obtained measured value $Z_6$, the amount of shift $Z_{10}$ in the optical axis direction due to the tilt of the reference flat mirror 13 with respect to the image plane in the TTL measurement as well as the amount of change $Z_{12}$ in the state of shape of the reference flat mirror 13 at the measurement image height, are reflected, whereby an optimum focus value $Z_7$ is determined (S214 and S215), as follows:

$$Z_7 = Z_6 + Z_{10} + Z_{12}.$$

In a practical exposure process, an offset having been determined in consideration of the wafer coating thickness or the height of the surface level difference (step) on the wafer, for example, is added to the best focus position determined in the manner described above. Then, the wafer is moved by the stage to be brought into registration with the thus obtained position, only through measurement with the focus detection optical system 14 (S216), and exposure of the wafer with the circuit pattern is performed (S217).

In accordance with the method described above, even if the position of the detection mark RWa provided on the reticle differs with different reticles, the measurement result is not influenced by the state of shape of the reference flat mirror 13, the tilt of the movement plane of the X-Y-Z stage 11, or the tilt of the image plane of the projection optical system 9. Therefore, accurate autofocus measurement can be achieved.

In an actual process wafer exposure, the reference mark 13a may be introduced at a predetermined timing or periodically, between exposure of a certain actual wafer, and focus measurement may be repeated by use of the focus detecting optical system 14 and the focal plane detecting optical system 27 while changing the focus, as has been described beforehand, such that a best focal plane can be determined automatically (S215). The X-Y-Z stage 11 may be driven in the Z direction, toward the thus determined position, to bring the wafer 12 surface to the best focal plane position of the projection lens 9 (S216). Then, the circuit pattern exposure may be performed (S217). Through execution of the above-described sequence, an optimum circuit pattern printing operation is accomplished.

Figure 3:
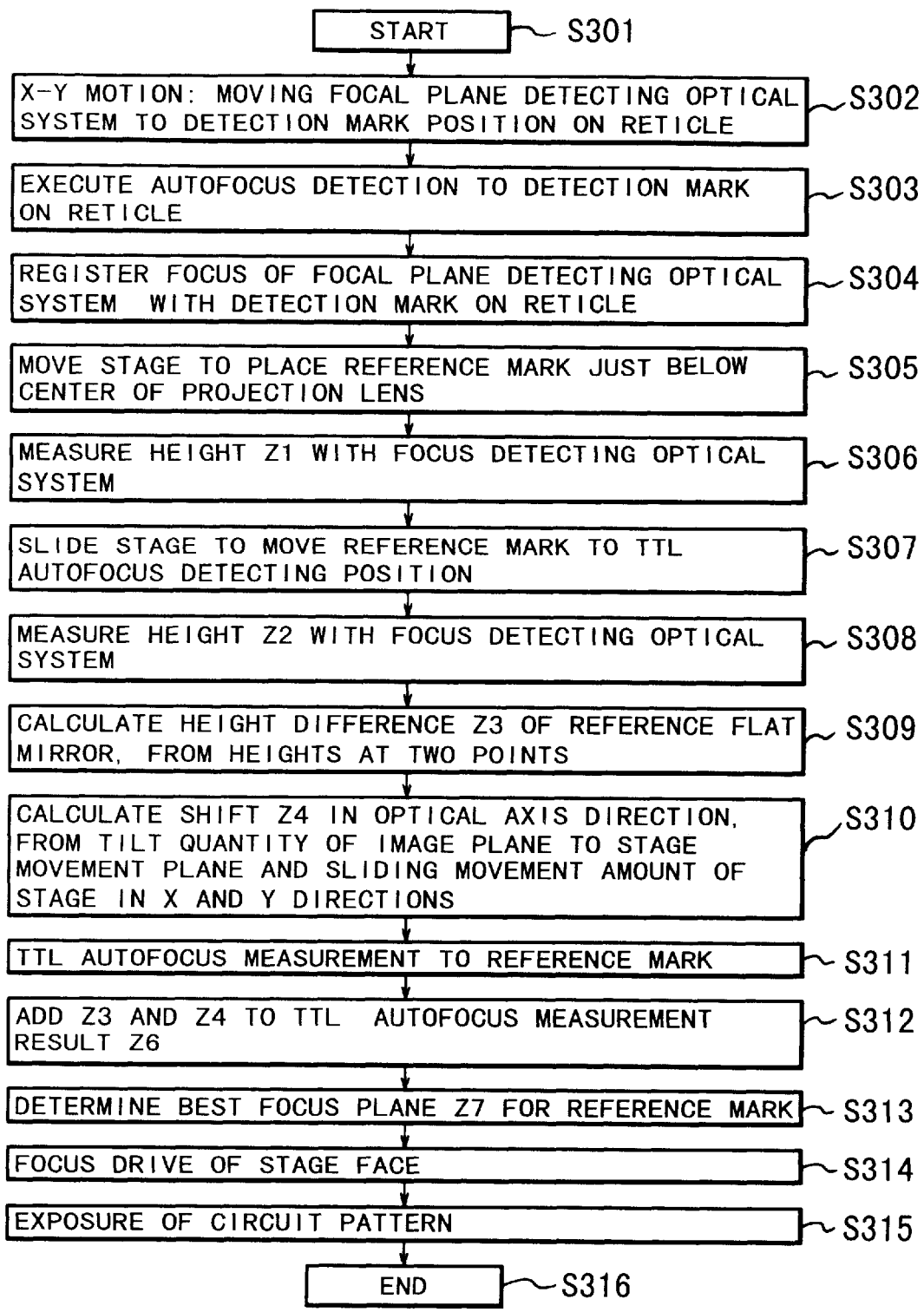
FIG. 3 is a flow chart of sequential operations for autofocus detection, in another example of the first embodiment of the present invention.

In this embodiment, the best focus value $Z_7$ may be determined on the basis of other values. FIG. 3 shows a flow chart therefor. The procedure up to the completion of detection of the difference $Z_3$ in height of the reference flat mirror 13 (S309) produced by the X-Y sliding motion of the reference mark 13a as well as detection of the amount of shift $Z_4$ in the optical axis direction (S310) due to the tilt of the image plane with respect to the stage movement plane 52, is substantially the same as those having been described hereinbefore. The measurement of the tilt of the reference flat mirror 13 with respect to the image plane by use of the focus detecting optical system 14 is unnecessary, in this example. Thereafter, the TTL autofocus measurement (S311) may be performed. Then, the values $Z_3$ and $Z_4$ may be added to the measured value $Z_6$ thus obtained (S312), whereby a best focus value $Z_7$ can be determined (S313), as follows:

$$Z_7 = Z_6 + Z_3 + Z_4.$$

[Embodiment 2]

Figure 4:
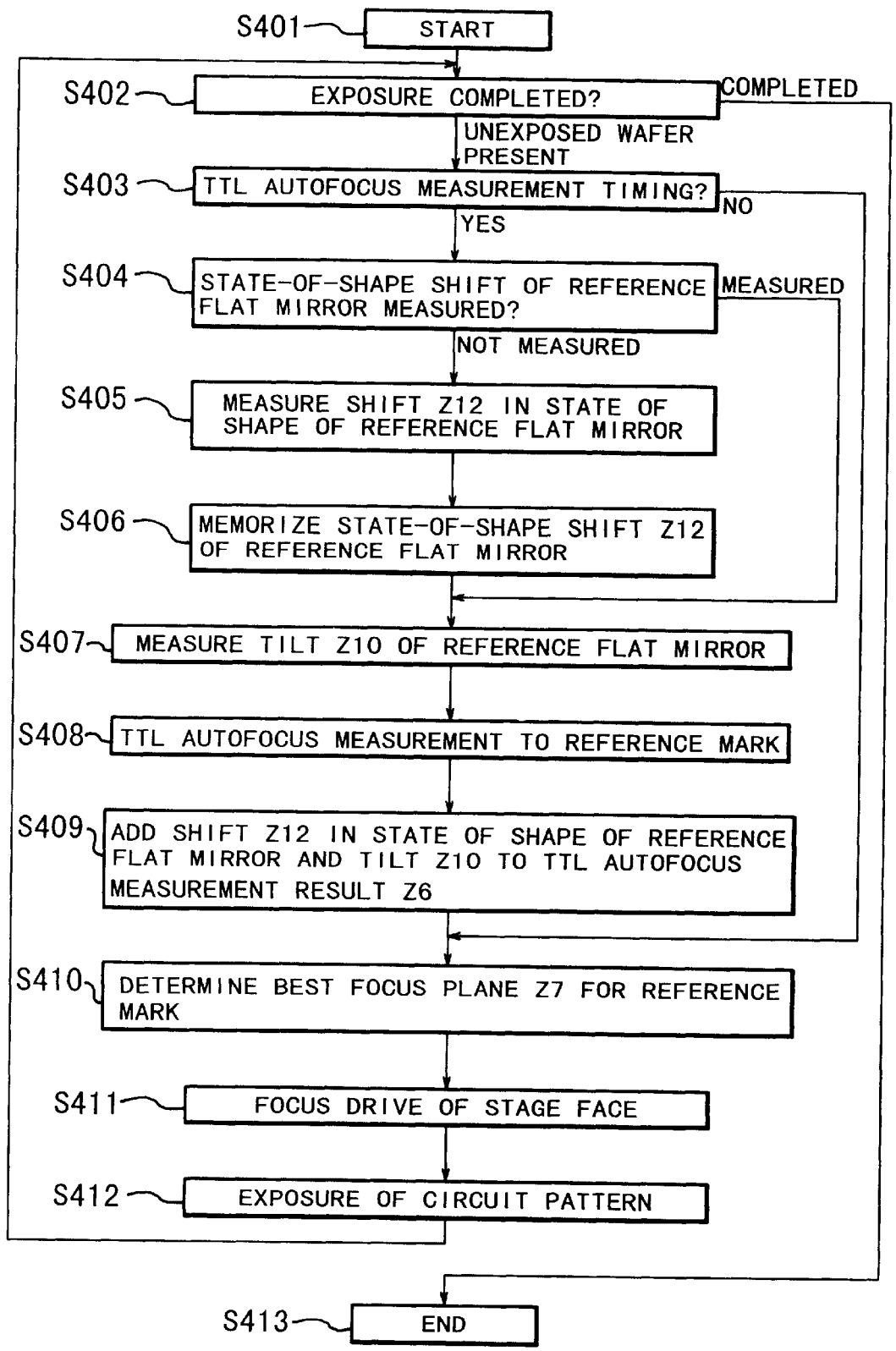
FIG. 4 is a flow chart of sequential operations for autofocus detection, according to a second embodiment of the present invention.

In the first embodiment described above, at every TTL autofocus measurement, the focusing operation to the reticle 6 surface (S203) and the measurement related to the state of shape of the reference flat mirror 13 are performed and, through the TTL autofocus measurement, a final measurement value is obtained. The second embodiment is an example wherein, as shown in FIG. 4, the execution of the process for measuring the change in state of shape of the reference flat mirror 13 (S220), to be performed simultaneously with the TTL autofocus measurement, is executed a first time in the actual process wafer exposure operation.

For the first time exposure, like the first embodiment, a best focus position $Z_7$ is determined on the basis of the amount of change $Z_{12}$ in the state of shape of the reference flat mirror 13, a tilt $Z_{10}$ of the reference flat mirror 13 with respect to the image plane, and a measured value $Z_6$ obtained through the TTL autofocus measurement (S403–S410). During these operations, the amount of change $Z_{12}$ in the state of shape of the reference flat mirror 13 is stored into a memory of the apparatus, not shown. For the second time exposure and exposures following it, only a tilt $Z_{10}$ of the reference flat mirror 13 with respect to the image plane as well as a measured value $Z_6$ obtainable through the TTL autofocus measurement are detected, while, on the other hand, as regards the amount of change $Z_{12}$ in the state of shape of the reference flat mirror 13, the value stored in the memory is used, by which a best focus value $Z_7$ is determined (S403, S404, and S407–S410).

Substantially the same advantageous results are attainable with this embodiment. Additionally, since the process for measuring the change in state of shape for the reference flat mirror 13 is executed only once, in the actual process wafer exposure, the throughput can be improved significantly.

[Embodiment 3]

Figure 5:
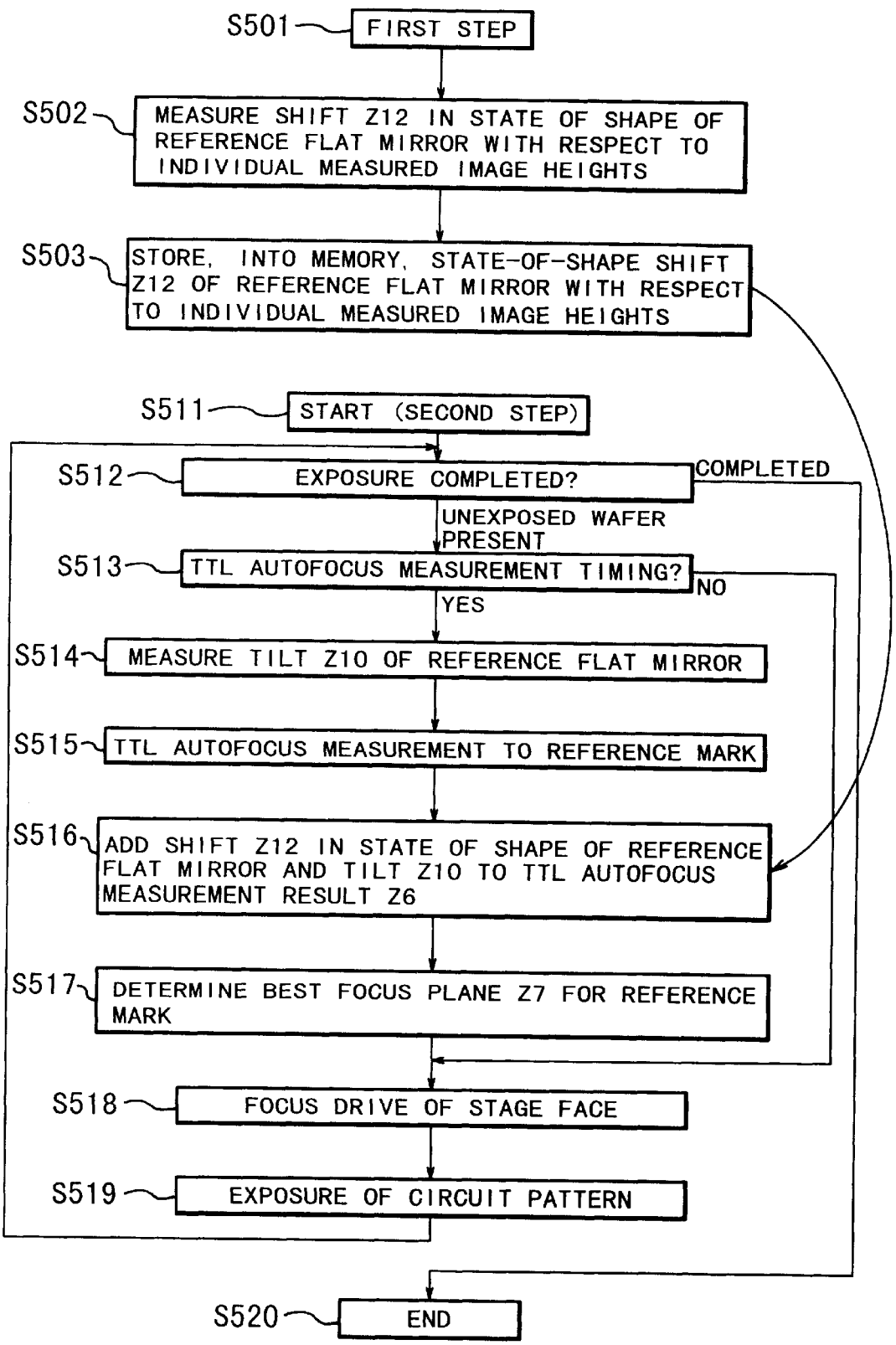
FIG. 5 is a flow chart of sequential operations for autofocus detection, according to a third embodiment of the present invention.

In this embodiment, as shown in FIG. 5, the amount of change in state of shape of the reference flat mirror 13 which may take any different values with different reticles, that is, different detection marks RWa, is measured in connection with every reticle and in relation to respective image heights. The thus obtained data is stored into a memory of the apparatus. Thus, during execution of the actual process wafer exposure, there is no necessity of performing the procedure for measuring the change in state of shape of the reference flat mirror 13 (S220).

More specifically, in connection with each of the reticles to be used in a first step, the amount of change $Z_{12}$ in the state of shape of the reference flat mirror 13 which may take different values with different reticles 6, that is, different detection marks RWa, is measured beforehand (S502). The thus obtained values are stored into a memory, as the data related to the individual reticles (S503).

For exposure of an actual process wafer in the second step, only a tilt $Z_{10}$ of the reference flat mirror 13 with respect to the image plane as well as a measured value $Z_6$ obtainable with the TTL autofocus measurement are detected. As regards the amount of change $Z_{12}$ in the state of shape of the reference flat mirror 13, an amount $Z_{12}$ corresponding to the same measurement image height is read out from the memory. On the basis of these values, a best focus position $Z_7$ is determined (S513–S517).

In accordance with this embodiment, the amount of change $Z_{12}$ in the state of shape of the reference flat mirror 13 should be measured with the apparatus once. After this, there is no necessity of performing the measurement operation to the reference flat mirror 13, in the exposure of an actual process wafer. Therefore, a further increase in the throughput is attainable.

[Embodiment 4]

Figure 6:
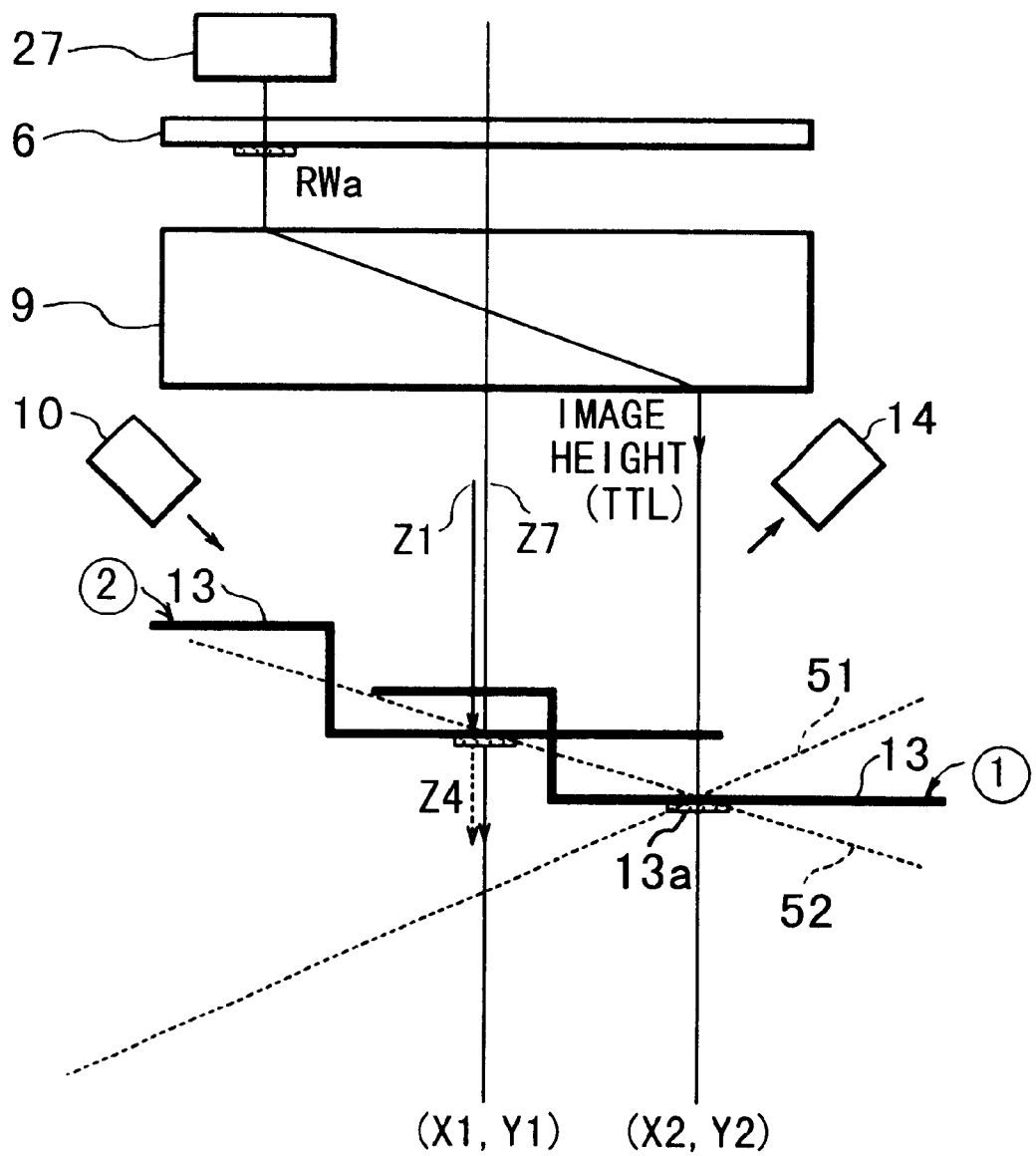
FIG. 6 is a schematic view of an autofocus detection system according to a fourth embodiment of the present invention.
Figure 7:
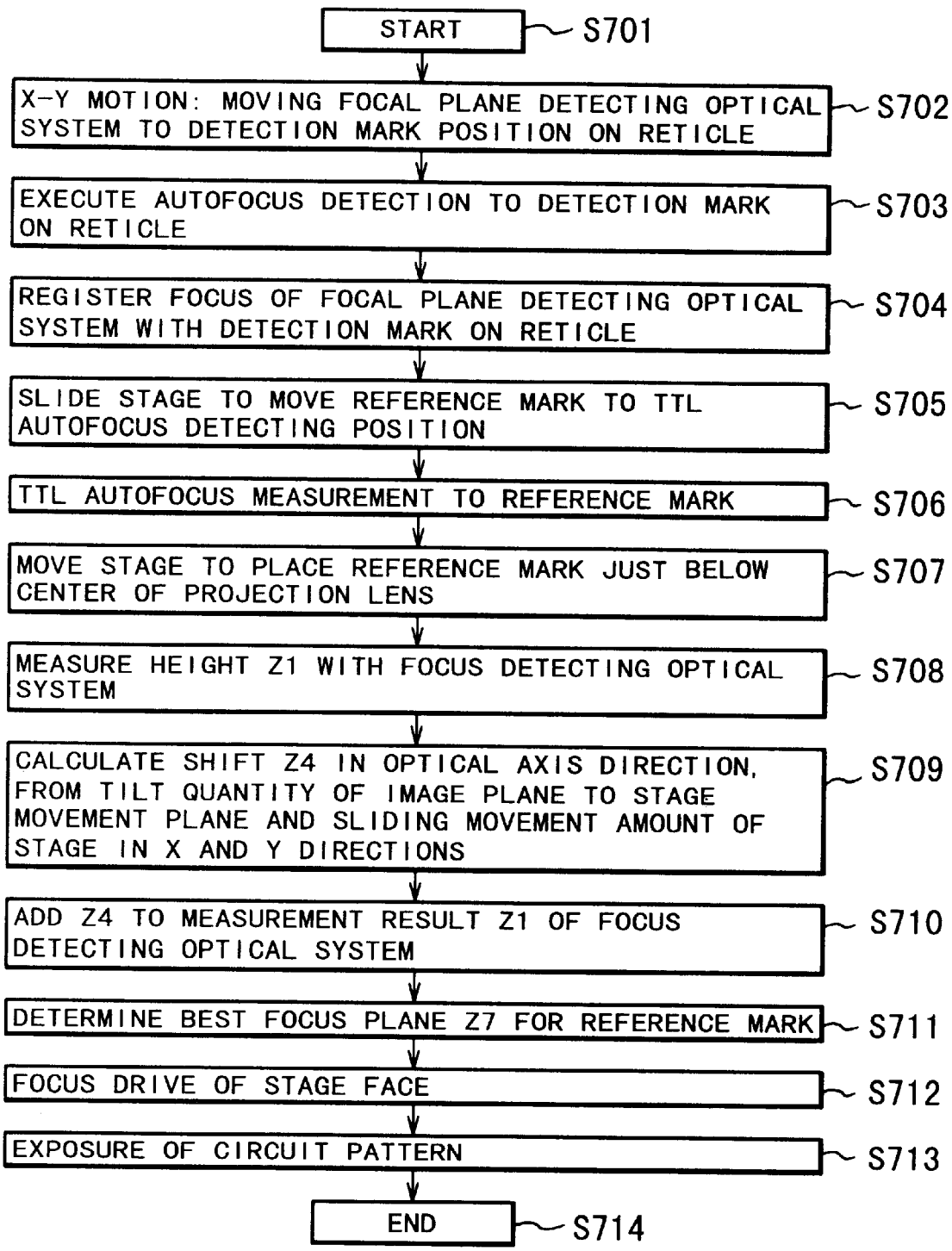
FIG. 7 is a flow chart of sequential operations for autofocus detection, in the fourth embodiment of the present invention.

FIG. 6 shows another embodiment of autofocus detection, and FIG. 7 is a flow chart for explaining the procedure thereof.

Reference characters $Z_1$, $Z_4$ and $Z_7$ in FIG. 6 are as follows:

$Z_1$ = the height of the mirror surface as the reference mark is on the optical axis;

$Z_4$: the amount of deviation from the image plane, to be produced by sliding motion of the stage; and $Z_7$: a measured value (after correction) in the TTLAF measurement.

In operation, first, the focus position of the focal plane detecting optical system is registered with a detection mark RWa (S701–S704), and the reference mark 13a on the reference flat mirror 13 is moved to a TTL autofocus position $(X_2, Y_2)$ (S705). After execution of the TTL autofocus measurement (S706), the reference mark 13a is moved, by X and Y sliding motion, so that it is placed on the optical axis position $(X_1, Y_1)$ (S707). The height $Z_1$ of the reference mark 13a at that time is measured by use of the focus detecting optical system 14 (S708). Also, like the first embodiment, the amount of shift $Z_4$ in the optical axis direction due to the tilt of the reference flat mirror 13 with respect to the stage movement plane 52, is detected on the basis of the tilt amount $(T_X, T_Y)$ of the image plane 51 with respect to the movement plane 52 of the X-Y-Z stage 11, having been measured beforehand, and the driving amount $(X_3, Y_3)$ through which the X-Y-Z stage 11 is slidingly moved in the X and Y directions (S709). As a result of this, the best focus position $Z_7$ can be determined as follows (S710–S711):

$$Z_7 = Z_1 + Z_4.$$

In accordance with the embodiments of the present invention as have been described hereinbefore, the surface detection can be accomplished appropriately, even if the registration detection for the surface should be performed at different positions (such as in an example wherein detection marks of originals provided for use with a focus detecting system are placed at positions which differ with different originals).

Further, by determining an error in a detection value to be produced by performing surface detection at an arbitrary position, stable detection of the optimum surface position can be accomplished.

As a result, the image plane position of a projection optical system can be adjusted very precisely and constantly, such that the production of a high-precision device is facilitated.

While the invention has been described with reference to the structures disclosed herein, it is not confined to the details set forth and this application is intended to cover such modifications or changes as may come within the purposes of the improvements or the scope of the following claims.

What is claimed is:

1. A position detecting method for detecting a position of a surface of an object, said method comprising:

a first step for detecting registration of the object surface with a predetermined plane with respect to a first direction, while changing the position of the object surface in a direction intersecting with the first direction;

a second step for detecting the position of the object surface in the first direction; and determining a detection value in said second detecting step, corresponding to the predetermined plane, by use of an error in the result of the detection made with reference to the predetermined plane, which error is attributable to a difference in the detection position along a direction intersecting with the first direction and upon the same object surface in said first and second detecting steps.

2. A method according to claim 1, wherein a detection value corresponding to the predetermined plane in the second step is determined by use of an error in a result of a detection made with reference to the predetermined plane, which error is attributable to a difference in detection position upon the same object surface in the first and second steps.

3. A method according to claim 1, wherein an error in the result of the detection made with reference to the predetermined plane is produced due to a tilt of the predetermined plane with respect to a direction perpendicular to the first direction.

4. A method according to claim 1, wherein an error in the result of the detection made with reference to the predetermined plane is produced due to a shape of the object surface.

5. A method according to claim 1, wherein an error in the result of the detection made with reference to the predetermined plane is produced due to a shift of the object surface in a direction intersecting with the first direction.

6. A method according to claim 1, wherein an error in the result of the detection made with reference to the predetermined plane concerns at least an error which is produced due to one of a shape of the object surface and a shift of the object surface in a direction intersecting with the first direction.

7. A position detecting system for detecting a position of a surface of an object, said system comprising:

a first detecting system for detecting registration of the object surface with a predetermined plane with respect to a first direction;

a second detecting system for detecting the position of the object surface in the first direction; and determining means for determining a detection value of said second detecting system, corresponding to the predetermined plane, by use of an error in the result of the detection made with reference to the predetermined plane, which error is attributable to a difference in the detection position along a direction intersecting with the first direction and upon the same object surface in said first and second detecting systems.

8. A position detecting system according to claim 7, wherein an error in the result of the detection made with reference to the predetermined plane is produced due to a tilt of the predetermined plane with respect to a direction perpendicular to the first direction.

9. A position detecting system according to claim 7, wherein an error in the result of the detection made with reference to the predetermined plane is produced due to a shape of the object surface.

10. A position detecting system according to claim 7, wherein an error in the result of the detection made with reference to the predetermined plane is produced due to a shift of the object surface in a direction intersecting with the first direction.

11. A position detecting system according to claim 7, wherein an error in the result of the detection made with reference to the predetermined plane concerns at least an error which is produced due to one of a shape of the object surface and a shift of the object surface in a direction intersecting with the first direction.

12. A position detecting system according to claim 7, wherein the detection value is determined on the basis of (i) a quantity of change in shape of the object surface, as the object is moved in a direction intersecting with the first direction so that the position of a mark on the object surface is shifted from an on-axis position where the position detection is to be made through said second detecting system to a position where registration of the object surface with the predetermined plane is to be detected through said first detecting system, (ii) a quantity of shift in the first direction due to a tilt of the predetermined plane with respect to a tilt direction of the object surface itself, and (iii) a measured value of said second detecting system produced at a position where registration of the mark with the predetermined plane is detected through said first detecting system.

13. A position detecting system according to claim 12, wherein, when the position detection for the object surface is repeated, a quantity of change in shape of the object surface is detected only in a first-time detecting operation, and wherein, in a detecting operation or operations following the first-time detecting operation, the detection value is determined by reflecting the quantity of change in shape of the object surface detected by the first-time detecting operation to a measured value or values of said second detecting system obtained in a state where the mark is registered with the predetermined plane, and the quantity of shift in the first direction due to a tilt of the predetermined plane with respect to a tilt direction of the object surface itself.

14. A position detecting system according to claim 12, wherein, when the position for detecting registration of the object surface with the predetermined plane through said first detecting system is variable, amounts of changes in shape of the object surface corresponding to different positions are detected beforehand and are stored into a storing system, and wherein, when the position detection for the object surface is repeated, the detection value is determined by reflecting a corresponding quantity of change in shape of the object surface to a measured value of said second detecting system obtained in a state where the mark is registered with the predetermined plane, and the quantity of shift in the first direction due to a tilt of the predetermined plane with respect to a tilt direction of the object surface itself.

15. A position detecting system according to claim 7, wherein the detection value is determined on the basis of (i) a quantity of change in a measured value of said second detecting system due to the shape of the object surface, as the object is moved in a direction intersecting with the first direction so that the position of a mark on the object surface is shifted from an on-axis position where the position detection is to be made through said second detecting system to a position where registration of the object surface with the predetermined plane is to be detected through said first detecting system, (ii) a quantity of shift in the first direction due to a tilt of the predetermined plane with respect to the movement direction of the object, and (iii) a measured value of said second detecting system produced at a position where registration of the mark with the predetermined plane is detected through said first detecting system.

16. A position detecting system according to claim 7, wherein the detection value is determined on the basis of (i) a measured value on the mark by said second detecting system, as the object is moved in a direction intersecting with the first direction so that the position of a mark on the object surface is shifted from a position where registration of the object surface with the predetermined plane is to be detected through said first detecting system, to an on-axis position where the position detection is to be made through said second detecting system, and (ii) a quantity of shift in the first direction due to a tilt of the predetermined plane with respect to a movement direction of the object.

17. A position detecting method for detecting a position of a surface of an object, said method comprising:

a first detecting step using a first detecting system, for observing the object surface through an imaging optical system while moving the object along an optical axis direction of the imaging optical system, to detect an in-focus position of the imaging optical system;

a second detecting step using a second detecting system, for detecting, without the imaging optical system, the position of the object surface along the optical axis direction;

a calculating step for calculating a deviation along the optical axis direction, which deviation is attributable to a difference between an image height position of the object surface detected by the first detecting system and an image height position of the object surface detected by the second detecting system; and a correcting step for correcting the detection result of the second detecting system, by use of the deviation calculated in said calculating step.

18. A position detecting system for detecting a position of a surface of an object, said system comprising:

an imaging optical system for forming an image of the object;

a first detecting system for observing the object surface through said imaging optical system while moving the object along an optical axis direction of said imaging optical system, to detect an in-focus position of said imaging optical system;

a second detecting system for detecting, without said imaging optical system, the position of the object surface along the optical axis direction;

calculating means for calculating a deviation along the optical axis direction, which deviation is attributable to a difference between an image height position of the object surface detected by said first detecting system and an image height position of the object surface detected by said second detecting system; and correcting means for correcting the detection result of said second detecting system, by use of the deviation calculated by said calculating means.

* * * * *

UNITED STATES PATENT AND TRADEMARK OFFICE
CERTIFICATE OF CORRECTION

PATENT NO.    : 6,539,326 B1
DATED         : March 25, 2003
INVENTOR(S)   : Tomohiko Hirano It is certified that error appears in the above-identified patent and that said Letters Patent is hereby corrected as shown below:

Column 3,
Line 20, "on-coming" should read -- oncoming --.

Column 12,
Line 16, "can" should read -- can be --.

Column 14,
Line 55, "respect of" should read -- respect to --.

Column 17,
Line 37, "is executed" should read -- is necessary only when the autofocus measurement is executed --.

Signed and Sealed this

Seventh Day of October, 2003

JAMES E. ROGAN
*Director of the United States Patent and Trademark Office*